(12) United States Patent
Sauers (10) Patent No.: US 9,439,304 B2
(45) Date of Patent: Sep. 6, 2016

(54) ROBUST CONSUMER ELECTRONIC DEVICE

(75) Inventor: Matthew Carlyle Sauers, Indianapolis, IN (US)

(73) Assignee: Roche Diabetes Care, Inc., Indianapolis, IN (US)

( * ) Notice: Subject to any disclaimer, the term of this patent is extended or adjusted under 35 U.S.C. 154(b) by 818 days.

(21) Appl. No.: 13/551,966

(22) Filed: Jul. 18, 2012

(65) Prior Publication Data

US 2012/0279048 A1 Nov. 8, 2012

Related U.S. Application Data

(62) Division of application No. 12/617,331, filed on Nov. 12, 2009, now Pat. No. 8,264,854.

(51) Int. Cl.
 *H05K 5/00* (2006.01)
 *H05K 7/14* (2006.01)

(52) U.S. Cl.
 CPC ............ *H05K 5/0017* (2013.01); *H05K 7/142* (2013.01); *Y10T 29/49002* (2015.01)

(58) Field of Classification Search
 CPC ................. Y10T 29/49002; Y10T 29/49227; H05K 3/326; H05K 2201/10378; H05K 5/0017; H05K 7/142; H05K 7/1434; H05K 7/1427
 See application file for complete search history.

(56) References Cited

U.S. PATENT DOCUMENTS

| | | | |
|---|---|---|---|
| 3,852,878 A | 12/1974 | Munro | |
| 3,971,610 A * | 7/1976 | Buchoff | G04C 3/005 174/254 |
| 4,050,756 A | 9/1977 | Moore | |
| 4,240,198 A | 12/1980 | Alonso | |
| 4,295,700 A | 10/1981 | Sado | |
| 4,586,607 A | 5/1986 | Dubbs et al. | |
| 4,889,498 A | 12/1989 | Mizuta | |
| 4,918,814 A | 4/1990 | Redmond et al. | |
| 5,037,312 A | 8/1991 | Casciotti | |
| 5,123,849 A | 6/1992 | Deak | |
| 5,734,136 A | 3/1998 | Newcomer et al. | |
| 5,735,040 A | 4/1998 | Ochi et al. | |
| 5,759,047 A * | 6/1998 | Brodsky | H01L 23/49811 439/66 |
| 5,822,192 A | 10/1998 | Hayashi | |

(Continued)

FOREIGN PATENT DOCUMENTS

| | | |
|---|---|---|
| EP | 1 113 713 A2 | 7/2001 |
| WO | WO 86/03893 | 7/1986 |

(Continued)

*Primary Examiner* — Livius R Cazan
(74) *Attorney, Agent, or Firm* — Roche Diabetes Care, Inc.

(57) ABSTRACT

A method includes providing a molded elastomeric mat having an input protrusion, an output device receiving surface including an output device contact, and a battery receiving indentation including a power supply contact. The method further includes insert molding an output conductive path into the elastomeric mat, the output conductive path electrically coupling a circuit carrier output contact to an output device contact, and insert molding a power supply conductive path into the elastomeric mat, the power supply conductive path electrically coupling a circuit carrier power contact to the power supply contact. The method includes interfacing the elastomeric mat with a circuit carrier, aligning the input protrusion with a circuit carrier input contact, interfacing a display device with the output device receiving surface, electrically connecting the display device with the output device contact, and positioning the elastomeric mat into a housing.

6 Claims, 4 Drawing Sheets

(56) References Cited

U.S. PATENT DOCUMENTS

| | | |
|---|---|---|
| 6,494,740 B1 | 12/2002 | Murakami |
| 6,854,985 B1 * | 2/2005 | Weiss ................. H01R 13/2414 439/591 |
| 6,888,537 B2 | 5/2005 | Benson et al. |
| 6,991,473 B1 | 1/2006 | Balcome et al. |
| 7,326,068 B2 | 2/2008 | Sturm et al. |
| 7,425,134 B1 | 9/2008 | Taylor |
| 7,576,988 B2 | 8/2009 | Schwarz |
| 2006/0072034 A1 | 4/2006 | Bhat et al. |
| 2009/0017649 A1 | 1/2009 | Wu et al. |
| 2009/0242242 A1 * | 10/2009 | Ishii ....................... H05K 3/326 174/254 |
| 2010/0081342 A1 * | 4/2010 | Nikaido ............ H01L 23/49827 439/709 |

FOREIGN PATENT DOCUMENTS

| | | |
|---|---|---|
| WO | WO 92/21167 | 11/1992 |
| WO | WO 2005/018056 | 2/2005 |
| WO | WO 2006/084971 | 8/2006 |
| WO | WO 2006/117462 | 11/2006 |

* cited by examiner

ROBUST CONSUMER ELECTRONIC DEVICE

CROSS-REFERENCE TO RELATED APPLICATIONS

The present application is a divisional of U.S. patent application Ser. No. 12/617,331 filed on Nov. 12, 2009, now U.S. Pat. No. 8,264,854, which is incorporated herein by reference in its entirety.

BACKGROUND

The technical field generally, but not exclusively, relates to small electronic devices, such as hand-held consumer electronic devices. Small consumer electronic devices regularly experience a challenging electromechanical environment. Devices are subjected to mechanical impulses (e.g. dropped), to temperature and humidity extremes, to contact or immersion in liquids, vibration, and/or electrostatic discharge. Further, consumer preferences create an incentive for devices to be designed as small and light as possible while still convenient to use, meaning for most devices that some presently available protective mechanisms are reduced or excluded. Further, each joint, coupling, or mating of mechanical parts introduces a potential failure point and/or a point of ingress for undesirable environmental agents such as liquids, particles, or electrostatic charges. Therefore, further technological developments are desirable in this area.

SUMMARY

One embodiment is a unique method for protecting electronic components of a consumer electronic device. Further embodiments include an article of manufacture including a robust consumer electronic device. Further embodiments, forms, objects, features, advantages, aspects, and benefits shall become apparent from the following description and drawings.

DESCRIPTION OF THE ILLUSTRATIVE EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended, any alterations and further modifications in the illustrated embodiments, and any further applications of the principles of the invention as illustrated therein as would normally occur to one skilled in the art to which the invention relates are contemplated herein.

Figure 1:
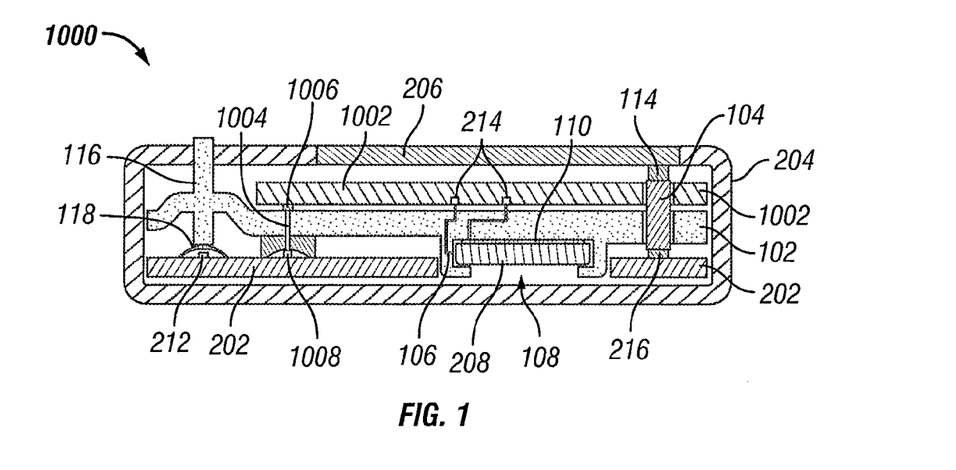
FIG. 1 is a schematic diagram of an electronic device having an elastomeric mat.
Figure 4:
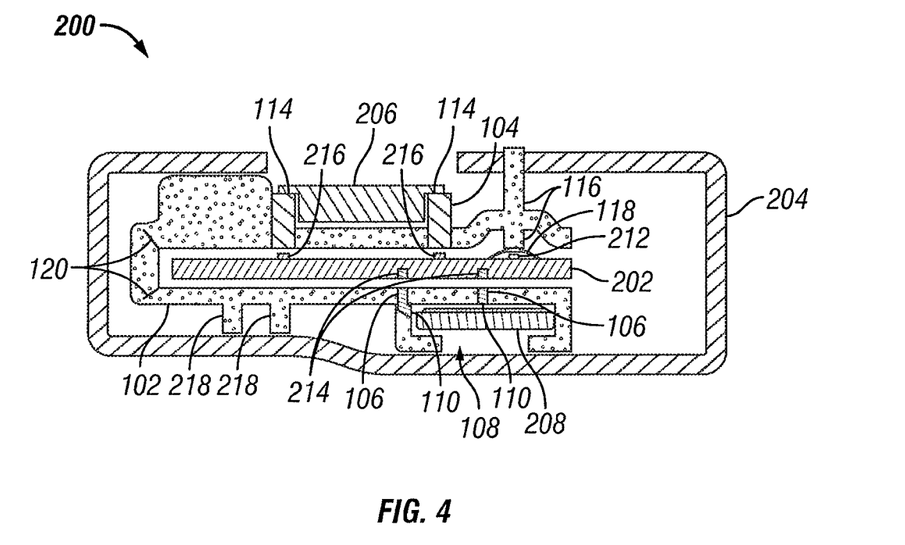
FIG. 4 is a schematic diagram of an elastomeric mat folded around a PCB and positioned in a housing.

FIG. 1 is a schematic diagram of an electronic device 1000 having an elastomeric mat 102. The elastomer may be any moldable, flexible material. In certain embodiments, the elastomer or portions of the elastomer may be non-conductive and/or non-porous to water. In certain embodiments, the elastomeric mat 102 includes laminated elastomers, stacked elastomers, an elastomer including an aggregate material, a homogenous mixture, and/or a composite material. The elastomeric mat 102, in certain embodiments, includes differing materials at varying positions within the elastomeric mat 102. For example, the elastomeric mat 102 may include a composite in certain portions, and rubber or rubber-like polymer at a sealing lip (e.g. reference FIG. 4 sealing lip 402).

Figure 2:
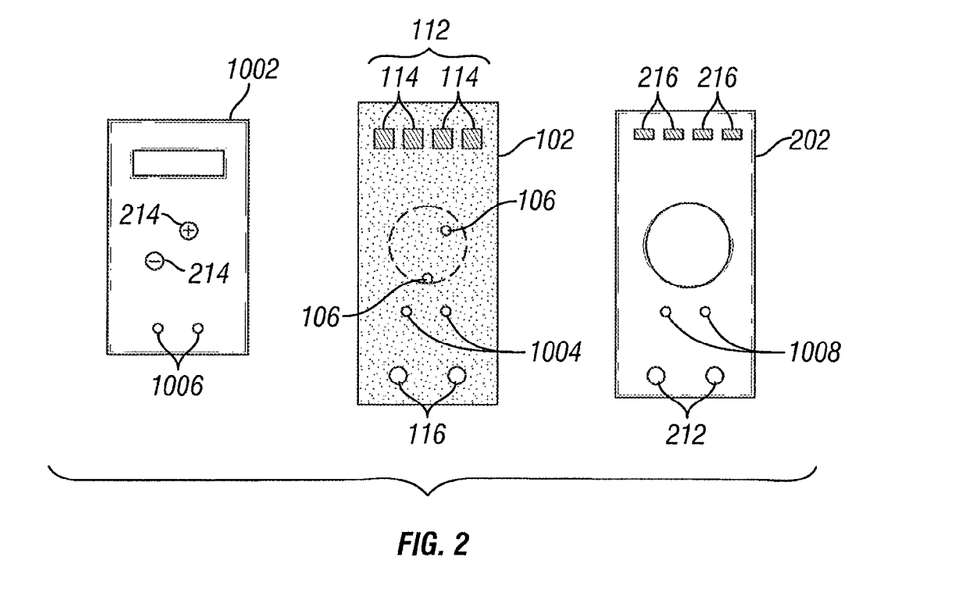
FIG. 2 is a schematic diagram of an elastomeric mat, a first PCB, and a second PCB.

The elastomeric mat 102 includes an output conductive path 104 therethrough, where the output conductive path 104 electrically couples a circuit carrier output contact 216 to an output device contact 114. The device 1000 includes an output device receiving surface 112, which includes the output device contact(s) 114—for example reference FIG. 2. In one example, the output conductive path 104 includes a pair of "zebra strips" that form a conductive path through the elastomeric mat 102 and can accept a liquid crystal display (LCD) screen at output device contacts 114 forming a part of the output device receiving surface 112. However, the output conductive path 104 may include conductive elastomer members, metal structure insert-molded into the elastomeric mat 102, or any other conductive structure that can be formed as a part of an output device receiving surface 112 and provide electronic communication between a circuit carrier 202 and the output device 206.

The elastomeric mat 102 further includes a power supply conductive path 106 that electrically couples a circuit carrier power contact 214 to a power supply contact 110. In certain embodiments, the elastomeric mat 102 further includes a battery receiving indentation 108. The battery receiving indentation 108 as shown includes elastomer formed to receive a coin-type battery 208, although any type of battery, fuel cell, or other power providing cartridge may be accommodated in various embodiments. In certain embodiments, the power supply conductive path 106 is alternatively or additionally connected to a power input for the device 1000, which may allow an external power source to be connected to the device 1000 (e.g. a DC power jack, an AC power cord extending from the device 1000, or any other power supply connection understood in the art). In the illustration of FIG. 1, the power supply conductive path 106 connects to the power supply contact 110 (the battery terminals). The power supply conductive path 106 may include conductive elastomer members, metal structure insert-molded into the elastomeric mat 102, or any other conductive structure that can be formed and that provides electronic communication between the circuit carrier 1002 and power supplied at the power supply contact 110.

The elastomeric mat 102 further comprises an input transfer path 116 positioned at a circuit carrier input contact 212. The input transfer path 116 transfers an input signal (not shown) from an input device (not shown) to the circuit carrier input contact 212. The input signal may be a mechanical signal (e.g. a button pushed by a user) or an electrical signal (e.g. a communication received on a network or datalink, or an electrical value provided by a switch, dial, etc.). The input transfer path 116 transfers the input signal either mechanically or electrically to the circuit carrier input contact 212. In the illustration of FIG. 1, the input transfer path 116 comprises an input protrusion from the elastomeric mat 102, and force applied on the protrusion collapses a metal dome 118 interposed between the input protrusion and the circuit carrier input contact 212, closing an electrical connection on the circuit carrier 202.

The input transfer path 116 in the example protrudes on both sides of the elastomeric mat 102. The input transfer path 116 may be formed integrally from the same material and with the elastomeric mat 102 as shown. In one example, the input transfer path 116 transfers external stimulus to the circuit carrier input contact 212 to communicate an input. In one example, pressure applied to the input transfer path 116 compresses the dome 118 which closes a switch between electrodes on the circuit carrier 202 which are then recognized and the circuit carrier 202 responds according to the hardware or software on the circuit carrier 202. In alternate embodiments, an electrical value, such as a voltage, current, or electronic message, is provided at the circuit carrier input contact 212 by the input transfer path 116 in response to external stimulus, and the circuit carrier 202 responds to the electrical value according to the hardware or software on the circuit carrier 202.

The electronic device 1000 includes at least one circuit carrier 202, 1002. The circuit carriers 202, 1002 include the circuit carrier output contact 216, the circuit carrier power contact 214, and the circuit carrier input contact 212. Each circuit carrier 202, 1002 may include any or all of the contacts 212, 214, 216, and in certain embodiments, the device 1000 may include only a single circuit carrier. The circuit carrier may be any circuit supporting device understood in the art, including without limitation a printed circuit board (PCB) or a logic circuit on a substrate.

The elastomeric mat 102 is positioned within a housing 204. The device 1000 further includes an output device 206 that engages the output device receiving surface 112 and that is electrically connected to the output device contact 114. The output device 206 includes an LCD screen, an LED screen, lights, or any other type of output display known in the art.

The elastomeric mat 102 may be sized to engage at least two opposing sides of the housing 204. In certain embodiments, the elastomeric mat 102 includes a means for shock absorption such that the circuit carrier(s) 202, 1002 experience an acceleration lower than a threshold acceleration in response to a predetermined mechanical impulse on the housing 204. The threshold acceleration may be defined in terms of a specified shock event—e.g. a fall of a predetermined height onto a surface having a predetermined coefficient of restitution, or in numerical terms such as an acceleration value below a given "g" rating. The means for shock absorption include the elastomeric mat 102 comprising an amount of shock absorbing material between the housing 204 and the circuit carrier 202, 1002 such that the threshold acceleration is not exceeded. The elastomeric mat 102 may include a material selected to have an appropriate spring rate and coefficient of restitution such that the circuit carrier 202, 1002 is decelerated consistent with the threshold acceleration in response to the predetermined mechanical impulse. Further, the elastomeric mat 102 may have a creep rate that allows the elastomeric mat 102 to flow around the circuit carrier 202, 1002 to be properly positioned for shock absorption between mechanical impulse events. The selection of a particular material and configuration is a mechanical step for one of skill in the art having the benefit of the disclosures herein. Generally, a heavier device 1000 and/or a higher predetermined mechanical impulse (high velocity impact and/or high coefficient of restitution of impact surface) requires a greater amount of elastomeric material having a lower spring rate and lower coefficient of restitution, and will therefore require a larger housing 204. Generally, a lighter device 1000 and/or a lower predetermined mechanical impulse (lower velocity impact and/or lower coefficient of restitution of impact surface) allows a lesser amount of elastomeric material having a higher spring rate and higher coefficient of restitution, and therefore allows a smaller housing 204.

Figure 6:
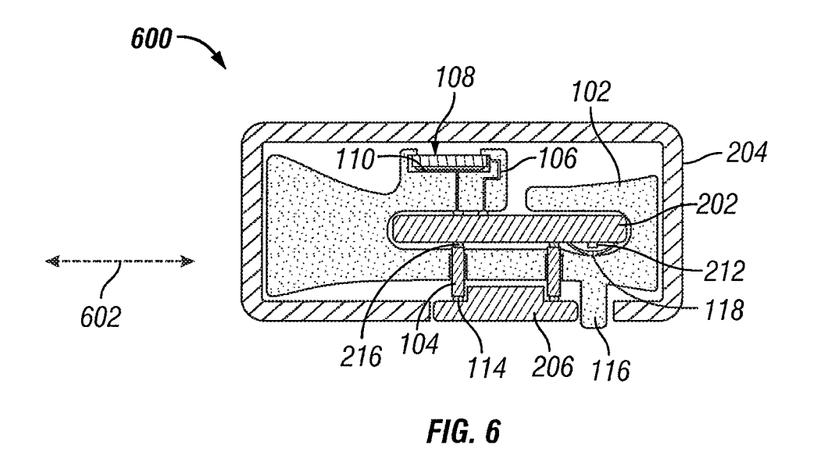
FIG. 6 is an illustration of an accelerometer including an elastomeric mat for directional shock absorption in a device housing the accelerometer.

In certain embodiments, the elastomeric mat 102 includes a means for directional shock absorption such that the circuit carrier(s) experience an acceleration lower than a threshold acceleration in response to a predetermined directional mechanical impulse on the housing. The means for directional shock absorption includes utilizing a greater amount of material in certain directions, and/or a material having a different shock absorption characteristic in certain directions. Referencing FIG. 6, a predetermined impulse direction 602 is managed with increased material of the elastomeric mat 102 in the direction 602. In one example, a device 600 may be an accelerometer for a device that experiences shock in a predetermined direction (e.g. a hammer), and the elastomeric mat 102 provides directional shock absorption. In certain embodiments, the device 600 includes a means for directional shock absorption that include anisotropic shock absorption. For example, a composite material grain, a pre-induced stress in the elastomeric mat 102, or other feature of the elastomeric mat 102 induces a differing coefficient of restitution and spring rate in the material of the elastomeric mat 102 that according to the direction of the stress on the material.

Figure 5:
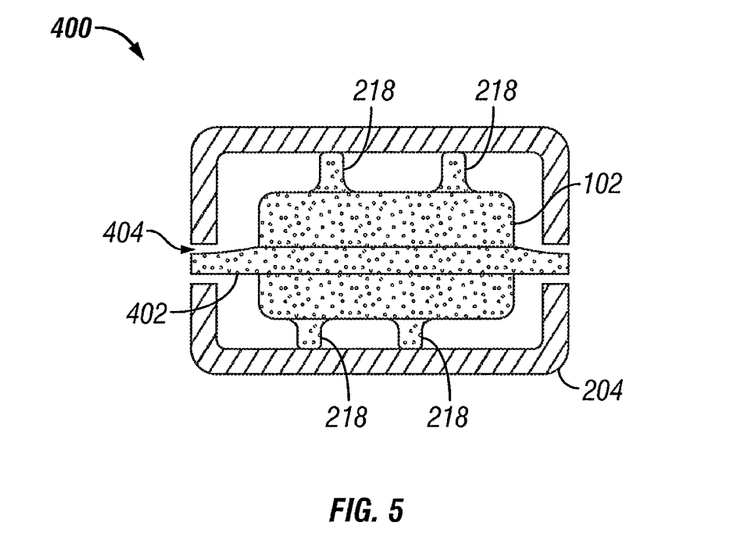
FIG. 5 is an illustration of an elastomeric mat having a sealing lip interposed in a seam of a housing.

Referencing FIG. 5, a device 400 includes an elastomeric mat 102 having a sealing lip 402 interposed in a seam 404 of the housing 204. The sealing lip 402 includes a material that is non-porous to liquids and/or is non-conducive to allowing ingress of an electrostatic charge into the device 400. The closing stress of the seam 404 may further be included in determining the sealing capability of the lip 402. The elastomeric mat 102 further includes stand-off protrusions 218 that engage at least two sides of the housing 204 and secure the elastomeric mat 102 within the housing.

Figure 3:
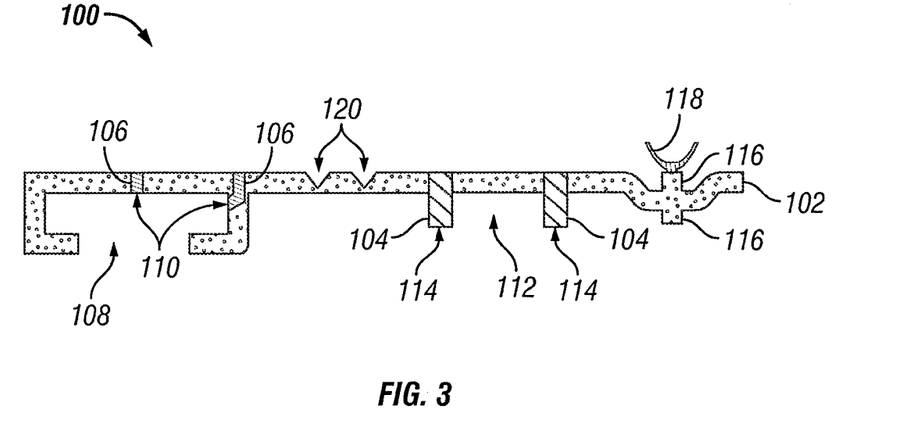
FIG. 3 is a schematic diagram of an elastomeric mat.

Referencing FIG. 1, the elastomeric mat 102 engages a first circuit carrier 202 on a first side of the mat and a second circuit carrier 1002 on a second side of the mat. Referencing illustration 200 of FIG. 4, the elastomeric mat 102 engages a circuit carrier 202 on two sides of the circuit carrier 202. The elastomeric mat 102 illustrated in FIG. 3 further includes a pair of folding notches 120, where the elastomeric mat 102 is folded (FIG. 4) around the circuit carrier 202 at the pair of folding notches 120. The folding notches 120 allow the elastomeric mat 102 to be folded at an identifiable location and with ease. The illustration 100 of FIG. 3 shows a pair of folding notches 120 such that the elastomeric mat 102 may be folded around a circuit carrier with a single fold. However, the elastomeric mat 102 may be folded around a circuit carrier in multiple folds in certain embodiments. For example, the elastomeric mat 102 may be wider and longer than the circuit carrier, and the elastomeric mat 102 may be folded over each edge (or more than one edge) of the circuit carrier. Any other configuration where the elastomeric mat 102 folds over any portion of the circuit carrier is contemplated herein.

The described arrangements of the elastomeric mat 102 with one or more circuit carriers 202, 1002 are exemplary only and non-limiting.

Referencing FIG. 1, a device 1000 includes a first printed circuit board (PCB) 202 and a second PCB 1002, where the first and second PCBs 202, 1002 include the circuit carrier input contact 212, the circuit carrier output contact 216, and the circuit carrier power contact 214. In the illustration of FIG. 1, the first PCB 202 includes the circuit carrier input contact 212 and the circuit carrier output contact 216, and the second PCB 1002 includes the circuit carrier power contact 214. However, any included circuit carrier may include any, all, or none of the contacts. The elastomeric mat 102 is positioned within a housing 204, and an output device 206 engages the output device receiving surface 112 (reference FIG. 2) and electrically connects to the output device contact 114. In certain further embodiments, the elastomeric mat 102 further includes a PCB conductive path 1004 between contacts 1006, 1008 that electrically couples the first PCB 202 and the second PCB 1002. The PCB conductive path 1004 allows the transfer of power, communication messages, and/or sharing of electrical values (e.g. a voltage, current, sensor value, input value, etc.) between the first PCB 202 and the second PCB 1002. The elastomeric mat 102 further includes a battery receiving indentation 108 having the power supply contact 110, and/or a sealing lip 402 (reference FIG. 5) interposed in a seam of the housing (reference FIG. 5). Any or all of the conductive paths 104, 106, 1004 or optionally conductive paths (e.g. the input transfer path 116 where the input is received electronically rather than mechanically) in the elastomeric mat 102 may be formed, without limitation, by insert-molded conductive materials and/or inclusion of conductive elastomeric materials at the conductive locations.

In certain embodiments, the elastomeric mat 102 further includes alignment features (not shown), where the alignment features prevent mis-alignment of the elastomeric mat with the first PCB 202, the second PCB 1002, and/or the housing 204. For example, the elastomeric mat 102 may include non-symmetrical tabs or indentations that prevent mating the elastomeric mat 102 with the first PCB 202, second PCB 1002, and/or housing 204 in an incorrect alignment. Non-symmetrical tabs or indentations are geometrically irreversible features, including tabs or indentations spaced differently on one side than another, a differing tab or indentation count on one side than another, and/or keyed tabs or indentations that disallow mating of an incorrect tab or indentation. Any other alignment features understood in the art and incorporated into the elastomeric mat 102 are contemplated herein.

Figure 7:
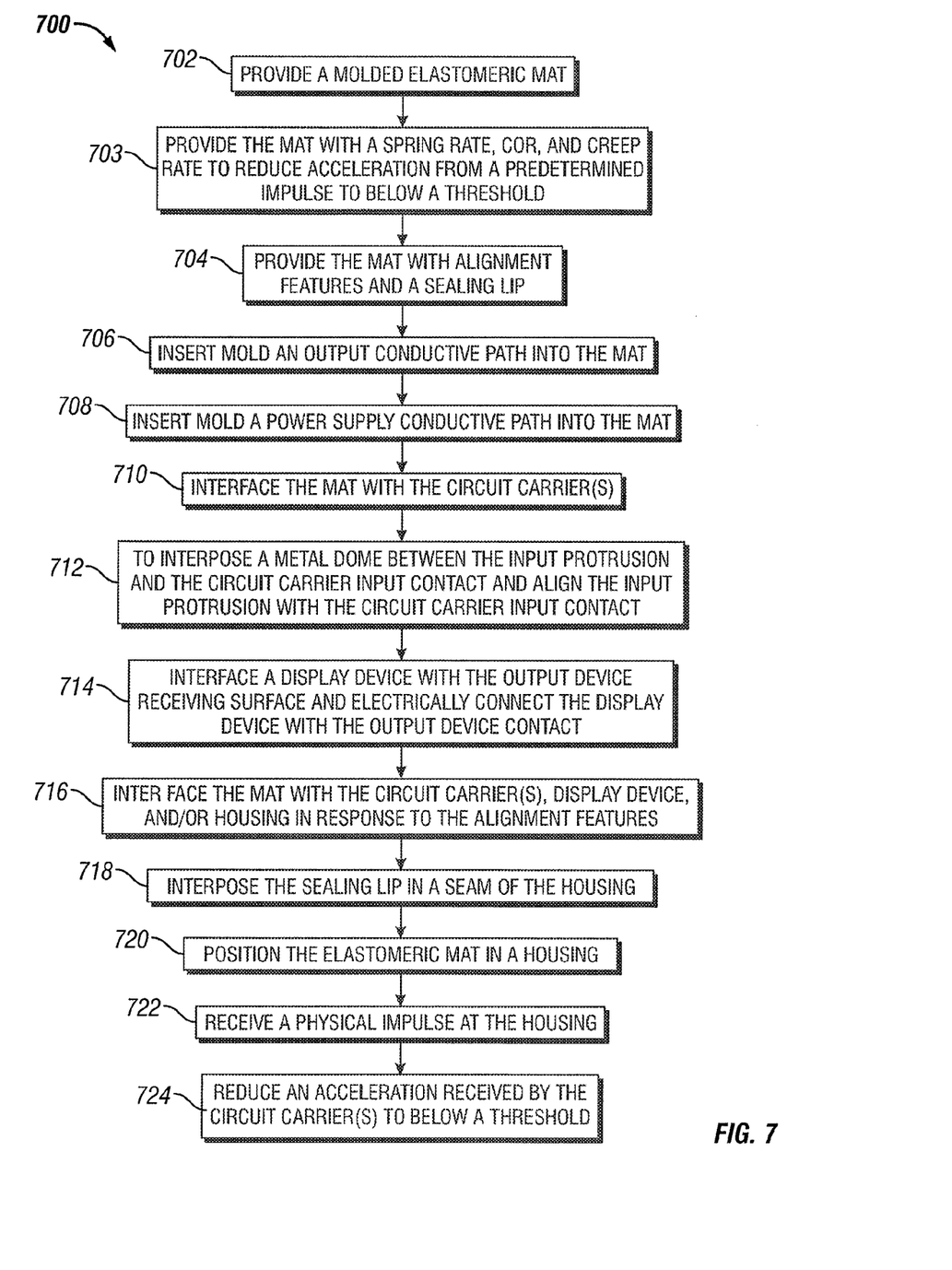
FIG. 7 is a schematic flow diagram of a procedure to produce a robust electronic device.

The schematic flow diagram in FIG. 7 and the related description which follows, provides an illustrative embodiment of a procedure for producing a robust electronic device. Operations illustrated are understood to be exemplary only, and operations may be combined or divided, and added or removed, as well as re-ordered in whole or part, unless stated explicitly to the contrary herein. Certain operations illustrated may be implemented by a computer executing a computer program product on a computer readable medium, where the computer program product comprises instructions causing the computer to execute one or more of the operations, or to issue commands to other devices to execute one or more of the operations.

A procedure 700 to produce a robust electronic device includes an operation 702 to provide a molded elastomeric mat having an input protrusion, an output device receiving surface including an output device contact, and a battery receiving indentation including a power supply contact. The procedure 700 further includes an operation 703 to provide the elastomeric mat with a spring rate, coefficient of restitution, and creep rate such that when the physical impulse has a predetermined energy the acceleration is lower than a threshold. In certain embodiments, operation 703 includes providing the elastomeric mat with an anisotropic acceleration reduction, where the elastomeric mat reduces the acceleration preferentially in a predetermined impulse direction. The procedure 700 further includes an operation 706 to insert mold an output conductive path into the elastomeric mat, the output conductive path electrically coupling a circuit carrier output contact to an output device contact, and an operation 708 to insert mold a power supply conductive path into the elastomeric mat, the power supply conductive path electrically coupling a circuit carrier power contact to the power supply contact. In certain embodiments, the procedure 700 includes an operation 710 to interface the elastomeric mat with at least one circuit carrier, an operation 712 to align the input protrusion with a circuit carrier input contact. The operation 712 may further include interposing a metal dome between the input protrusion and the circuit carrier input contact, with a convex side of the metal dome facing the input protrusion. The procedure 700 further includes an operation 714 to interface a display device with the output device receiving surface thereby electrically connecting the display device with the output device contact, and an operation 720 to position the elastomeric mat into a housing.

In certain embodiments, the procedure 700 includes an operation 704 to provide the elastomeric mat with alignment features and/or a sealing lip, an operation 716 to interface the elastomeric mat with a circuit carrier, the display device, and/or the housing in response to the alignment features, an operation 718 to interpose the sealing lip in a seam of the housing, and an operation 720 to position the elastomeric mat in the housing. In certain embodiments, the procedure 700 further includes an operation 722 to receive a physical impulse with the housing, and an operation 724 to reduce an acceleration received by the circuit carrier in response to the receiving.

As is evident from the figures and text presented above, a variety of embodiments according to the present invention are contemplated.

One exemplary embodiment is an article of manufacture, including an elastomeric mat having an output conductive path therethrough, where the output conductive path electrically couples a circuit carrier output contact to an output device contact. The elastomeric mat further includes a power supply conductive path that electrically couples a circuit carrier power contact to a power supply contact, an output device receiving surface that includes the output device contact and that receives an output device, and an input transfer path positioned at a circuit carrier input contact. The input transfer path transfers an input signal from an input device to the circuit carrier input contact, where the input signal is a mechanical or electrical signal, and is transferred either mechanically or electrically.

The article of manufacture further includes at least one circuit carrier that includes the circuit carrier output contact, the circuit carrier power contact, and the circuit carrier input contact. The circuit carrier may be any circuit supporting device understood in the art, including without limitation a printed circuit board or a logic circuit on a substrate. The elastomeric mat is positioned within a housing. The article of manufacture further includes an output device that engages the output device receiving surface and that is electrically connected to the output device contact.

In certain embodiments, the elastomeric mat further includes a battery receiving indentation that includes the power supply contact and is structured to receive a battery. The elastomeric mat may be sized to engage at least two opposing sides of the housing. In certain embodiments, the elastomeric mat includes a means for shock absorption such that the circuit carrier(s) experience an acceleration lower than a threshold acceleration in response to a predetermined mechanical impulse on the housing. A non-limiting example of a predetermined mechanical impulse includes a fall of a predetermined height onto a surface having a predetermined coefficient of restitution. In certain embodiments, the elastomeric mat includes a means for directional shock absorption such that the circuit carrier(s) experience an acceleration lower than a threshold acceleration in response to a predetermined directional mechanical impulse on the housing. The means for directional shock absorption may include anisotropic shock absorption.

Certain embodiments of the article of manufacture include the elastomeric mat further having a sealing lip interposed in a seam of the housing, the elastomeric mat engaging a first circuit carrier on a first side of the mat and a second circuit carrier on a second side of the mat, and the elastomeric mat engaging a circuit carrier on two sides of the circuit carrier. The elastomeric mat, in certain embodiments, further includes a pair of folding notches, where the elastomeric mat is folded around the circuit carrier at the pair of folding notches.

In certain embodiments, the elastomeric mat includes laminated elastomers, stacked elastomers, an elastomer including an aggregate material, a homogenous mixture, and/or a composite material. In certain further embodiments, the elastomeric mat includes differing materials at varying positions within the elastomeric mat. Non-limiting examples of the output conductive path, the power supply conductive path, and/or the input transfer path include insert molded electrically conductive elements. An exemplary input transfer path includes a protrusion of the elastomeric mat that transfers an external mechanical input to the circuit carrier input contact. The article of manufacture may further include a metal dome coupled to the input protrusion.

Another exemplary embodiment is a method including providing a molded elastomeric mat having an input protrusion, an output device receiving surface including an output device contact, and a battery receiving indentation including a power supply contact. The method further includes insert molding an output conductive path into the elastomeric mat, the output conductive path electrically coupling a circuit carrier output contact to an output device contact, and insert molding a power supply conductive path into the elastomeric mat, the power supply conductive path electrically coupling a circuit carrier power contact to the power supply contact. In certain embodiments, the method includes interfacing the elastomeric mat with at least one circuit carrier, aligning the input protrusion with a circuit carrier input contact, interfacing a display device with the output device receiving surface, electrically connecting the display device with the output device contact, and positioning the elastomeric mat into a housing.

Certain embodiments of the method further include providing the elastomeric mat with alignment features, and interfacing the elastomeric mat with a circuit carrier, the display device, and/or the housing in response to the alignment features. In further embodiments, the method includes providing the elastomeric mat with a sealing lip and interposing the sealing lip in a seam of the housing. Further embodiments include interposing a metal dome between the input protrusion and the circuit carrier input contact, with a convex side of the metal dome facing the input protrusion.

The exemplary method further includes receiving a physical impulse with the housing, and reducing an acceleration received by the circuit carrier in response to the receiving. The method includes providing the elastomeric mat with a spring rate, coefficient of restitution, and creep rate such that when the physical impulse has a predetermined energy the acceleration is lower than a threshold. In certain embodiments, the method includes providing the elastomeric mat with an anisotropic acceleration reduction, where the elastomeric mat reduces the acceleration preferentially in a predetermined impulse direction.

Another exemplary embodiment is an article of manufacture including an elastomeric mat having an output conductive path therethrough, where the output conductive path electrically couples a circuit carrier output contact to an output device contact. The elastomeric mat further includes a power supply conductive path electrically coupling a circuit carrier power contact to a power supply contact, an output device receiving surface comprising the output device contact and structured to receive an output device, and an input transfer path positioned at a circuit carrier input contact, where the input transfer path transfers an input signal from an input device to the circuit carrier input. The input signal may be electrical or mechanical, and the input transfer path may transfer the input signal mechanically and/or electrically.

The article of manufacture further includes a first printed circuit board (PCB) and a second PCB, where the first and second PCBs include the circuit carrier input contact, the circuit carrier output contact, and the circuit carrier power contact. The elastomeric mat is positioned within a housing, and an output device engages the output device receiving surface and electrically connects to the output device contact. In certain further embodiments, the elastomeric mat further includes a PCB conductive path that electrically couples the first PCB and the second PCB. The elastomeric mat further includes a battery receiving indentation having the power supply contact, and/or a sealing lip interposed in a seam of the housing.

In certain embodiments, the output conductive path, the power supply conductive path, and/or the input transfer path are insert molded electrically conductive elements. In certain embodiments, the input transfer path is a protrusion of the elastomeric mat that transfers an external mechanical input to the circuit carrier input contact, and the article of manufacture further includes a metal dome coupled to the input protrusion. In certain embodiments, the elastomeric mat further includes alignment features, where the alignment features prevent mis-alignment of the elastomeric mat with the first PCB, the second PCB, and/or the housing.

While the invention has been illustrated and described in detail in the drawings and foregoing description, the same is to be considered as illustrative and not restrictive in character, it being understood that only certain exemplary embodiments have been shown and described and that all changes and modifications that come within the spirit of the inventions are desired to be protected. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method of manufacturing an electronic device, the method comprising the steps of:

providing a molded elastomeric mat with:
  an input protrusion;
  an output device receiving surface comprising an output device contact;
  a battery receiving indentation comprising a power supply contact;
insert molding an output conductive path and a power supply conductive path into the elastomeric mat;
interfacing the elastomeric mat with at least one circuit carrier, wherein the at least one circuit carrier comprises a circuit carrier output contact, a circuit carrier power contact and a circuit carrier input contact, wherein the output conductive path of the elastomeric mat electrically couples the circuit carrier output contact to the output device contact, and wherein the power supply conductive path of the elastomeric mat electrically couples the circuit carrier power contact to the power supply contact, and aligning the input protrusion with the circuit carrier input contact;
interfacing a display device of the electronic device with the output device receiving surface of the elastomeric mat and electrically connecting the display device with the output device contact; and
positioning the elastomeric mat into a housing of the electronic device.

2. The method of claim 1, further comprising providing the elastomeric mat with a plurality of alignment features, and performing at least one of the:

interfacing the elastomeric mat with at least one circuit carrier;
  interfacing the display device with the output device receiving surface; and
  positioning the elastomeric mat into the housing;
  in response to the alignment features.

3. The method of claim 1, further comprising providing the elastomeric mat with a sealing lip, and interposing the sealing lip in a seam of the housing.

4. The method of claim 1, further comprising interposing a metal dome between the input protrusion and the circuit carrier input contact, with a convex side of the metal dome facing the input protrusion.

5. The method of claim 1, further comprising providing the elastomeric mat with a spring rate, coefficient of restitution, and creep rate such that when a physical impulse applied to the housing has a predetermined energy, an acceleration of the circuit carrier in the housing is lower than a threshold.

6. The method of claim 1, further comprising providing the elastomeric mat with an anisotropic acceleration reduction, wherein the elastomeric mat reduces an acceleration of the circuit carrier in the housing preferentially in a predetermined impulse direction.

* * * * *